United States Patent
Gong et al.

(10) Patent No.: US 11,296,659 B2
(45) Date of Patent: Apr. 5, 2022

(54) SWITCHLESS BI-DIRECTIONAL AMPLIFIER USING NEUTRALIZED DIFFERENTIAL PAIR

(71) Applicant: GEORGIA TECH RESEARCH CORPORATION, Atlanta, GA (US)

(72) Inventors: Yunyi Gong, Atlanta, GA (US); Moon-Kyu Cho, Atlanta, GA (US); John D. Cressler, Atlanta, GA (US); Ickhyun Song, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 16/981,741

(22) PCT Filed: Mar. 20, 2019

(86) PCT No.: PCT/US2019/023124
§ 371 (c)(1),
(2) Date: Sep. 17, 2020

(87) PCT Pub. No.: WO2019/183194
PCT Pub. Date: Sep. 26, 2019

(65) Prior Publication Data
US 2021/0126590 A1    Apr. 29, 2021

Related U.S. Application Data

(60) Provisional application No. 62/646,629, filed on Mar. 22, 2018.

(51) Int. Cl.
*H03F 1/42*    (2006.01)
*H03F 3/45*    (2006.01)

(52) U.S. Cl.
CPC ........... *H03F 1/42* (2013.01); *H03F 3/45076* (2013.01); *H03F 2200/36* (2013.01); *H03F 2200/451* (2013.01)

(58) Field of Classification Search
CPC .... H03F 1/42; H03F 3/45076; H03F 2200/36; H03F 2200/451; H03F 3/62; H03F 3/00; H03F 1/00; H03F 3/04
(Continued)

(56) References Cited

U.S. PATENT DOCUMENTS 3,855,431 A * 12/1974 Stewart ................... H04B 3/36
379/405
2003/0038678 A1    2/2003 Dessard et al.
(Continued)

OTHER PUBLICATIONS

International Search Report and Written Opinion dated Jul. 3, 2019, from International Application No. PCT/US2019/023124, 12 pages.

*Primary Examiner* — Hieu P Nguyen
(74) *Attorney, Agent, or Firm* — Meunier Carlin & Curfman LLC (57) ABSTRACT

A bi-directional amplifier (BDA) comprises a first pair of amplifier transistors and a second pair of amplifier transistors, wherein the first pair of amplifier transistors are cross-coupled with the second pair of amplifier transistors, and wherein the first pair of amplifier transistors and the second pair of amplifier transistors each comprise a differential common-emitter (CE) pair (or common-source (CS) pair) with equal transistor size or different transistor size. The BDA further comprises a plurality of blocking capacitors to decouple the collector and the base biases of the first pair of amplifier transistors and the second pair of amplifier transistors. Alternatively or additionally, the BDA further comprises two input/output baluns, through which a common voltage bias is applied to the collectors of each of the differential CE pairs (or drains of CS pairs in some implementations). The baluns enable single-ended measurement and characterization.

20 Claims, 4 Drawing Sheets

(58) Field of Classification Search
USPC .......................................... 330/252–261, 301
See application file for complete search history.

(56) References Cited

U.S. PATENT DOCUMENTS

| | | |
|---|---|---|
| 2010/0007416 A1 | 1/2010 | Meharry |
| 2010/0060360 A1 | 3/2010 | Berg et al. |
| 2014/0184329 A1 | 7/2014 | Shoham et al. |
| 2015/0022266 A1 | 1/2015 | Rajaee |
| 2015/0349721 A1 | 12/2015 | Samavedam et al. |

* cited by examiner

SWITCHLESS BI-DIRECTIONAL AMPLIFIER USING NEUTRALIZED DIFFERENTIAL PAIR

CROSS-REFERENCE TO RELATED APPLICATIONS

This application claims the benefit of U.S. provisional patent application No. 62/646,629, filed on Mar. 22, 2018, and entitled "A SWITCHLESS BI-DIRECTIONAL AMPLIFIER USING NEUTRALIZED COMMON-EMITTER DIFFERENTIAL PAIR FOR 5G CELLULAR APPLICATION," the disclosure of which is expressly incorporated herein by reference in its entirety.

BACKGROUND

The increase of mobile data and bandwidth demand and the use of connected electronic devices presents unprecedented challenges for the telecommunication industry. The amount of IP (Internet protocol) data handled by wireless networks is expected to increase from under 3 exabytes in 2010 to over 190 exabytes by 2018, and exceed 500 exabytes by 2020. As the fourth generation (4G) LTE (long term evolution) system is reaching saturation, the industry is in the process of transitioning to the fifth generation (5G) of wireless technology. With the 5G expected to be rolled out in 2020, industrial RFIC (radio frequency integrated circuit) design groups and university research labs are ramping up investment and efforts in finding innovative solutions to address the 5G challenges.

Phased arrays are useful for implementing 5G communication systems because they enable electrical beam forming which is essential to establish high data rate links. Digital transmit/receive (T/R) modules are usually incorporated in each transceiver channel to control signal amplitude and phase. Despite their high loss, T/R modules with passive attenuators and phase shifters are attractive for their high linearity and ability to support bidirectional signal flow. Although loss in passive T/R modules can potentially be tolerated at the system level by using high-gain front-end amplifiers, doing so significantly increases the design challenge for realizing the optimal front-end building blocks. Another solution to the high loss from passive components is compensation with unidirectional interstage amplifiers. However, this approach forfeits the benefits of the bidirectionality of the passive T/R module. The additional single pole double throw (SPDT) switches needed for signal routing increase system complexity and introduce loss.

SUMMARY

A switchless bi-directional amplifier (BDA) is disclosed. The BDA cross-couples two pairs of amplifier transistors and takes advantage of the OFF amplifier to enhance the performance of the ON amplifier.

Also disclosed herein is a switchless BDA using a neutralized differential common-emitter (CE) amplifier core for bipolar technology implementations, and using a neutralized differential common-source (CS) amplifier core for field-effect transistor (FET) technology implementations. On-chip transformer-based input/output baluns are included in the BDA for single-ended measurement and characterization.

In one aspect, disclosed herein is a bi-directional amplifier (BDA) comprising a first pair of amplifier transistors, and a second pair of amplifier transistors, wherein the first pair of amplifier transistors are cross-coupled with the second pair of amplifier transistors, and wherein the first pair of amplifier transistors and the second pair of amplifier transistors each comprise a differential common-emitter (CE) pair or a differential common-source (CS) pair, with equal transistor size or with different transistor sizes.

In some implementations, the BDA further comprises a plurality of blocking capacitors to decouple the collector and the base biases (e.g., for bipolar technology) of the first pair of amplifier transistors and the second pair of amplifier transistors.

Alternatively or additionally, the BDA further comprises two input/output baluns, through which a common voltage bias is applied to the collectors of each of the differential CE pairs (or drains of CS pairs in some implementations). The baluns enable single-ended measurement and characterization.

In some implementations, the first pair of amplifier transistors and the second pair of amplifier transistors are configured to provide a direction of operation when one differential CE pair (or CS pair in some implementations) is turned on and the other differential CE pair (or CS pair in some implementations) is turned off by pulling down the base bias or the gate bias through large bias resistors.

According to some aspects, the first pair of amplifier transistors cross-coupled with the second pair of amplifier transistors comprises the bases and collectors of the first differential CE pair cross-coupled with the collector-base (CB) junctions of the second pair of amplifier transistors for capacitive neutralization. Alternatively or additionally, the performance of the first pair of amplifier transistors when ON is enhanced by the second OFF pair of amplifier transistors.

Also disclosed herein is a BDA comprising a neutralized differential common-emitter (CE) amplifier core. Also disclosed herein is a BDA comprising a neutralized differential common-source (CS) amplifier core.

In some implementations, the BDA is s less. Alternatively or additionally, the BDA is a switchless differential BDA.

In one aspect, disclosed herein is a method comprising supplying collector or drain voltage to two differential pairs of transistors of a bi-directional amplifier (BDA), wherein each of the two differential pairs of transistors comprises a pair of amplifier transistors; turning on a first pair of the two differential pairs of transistors by applying a base or gate bias voltage to the one differential pair of transistors; and turning off a second pair of the two differential pairs of transistors by pulling down the base or gate bias of the transistors of the second pair.

In some implementations, a first pair of amplifier transistors are cross-coupled with a second pair of amplifier transistors, and wherein the first pair of amplifier transistors and the second pair of amplifier transistors each comprise a differential common-emitter (CE) pair or a differential common-source (CS) pair.

In some implementations, the BDA is biased in forward operation mode.

In some implementations, supplying the collector or drain voltage comprises supplying the voltage through center taps of secondary windings of two input/output transformer baluns in electrical connection with the BDA.

In some implementations, the method further comprises providing an incident RF (radio frequency) signal to two input terminals of the BDA. Positive RF signal power flows in to the base of a transistor of one of the two differential pairs of transistors through a decoupling capacitor, and an inverted and amplified signal exits the collector of the transistor and reaches a negative output terminal of the BDA.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

DETAILED DESCRIPTION

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise.

The term "comprising" and variations thereof as used herein is used synonymously with the term "including" and variations thereof and are open, non-limiting terms.

The terms "optional" or "optionally" used herein mean that the subsequently described feature, event, or circumstance may or may not occur, and that the description includes instances where said feature, event, or circumstance occurs and instances where it does not.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that when a value is disclosed that "less than or equal to" the value, "greater than or equal to" the value and possible ranges between values are also disclosed, as appropriately understood by the skilled artisan. For example, if the value "10" is disclosed, the "less than or equal to 10" as well as "greater than or equal to 10" is also disclosed. It is also understood that the throughout the application, data is provided in a number of different formats, and that this data represents endpoints and starting points, and ranges for any combination of the data points. Far example, if a particular data point "10" and a particular data point "15" are disclosed, it is understood that greater than, greater than or equal to, fess than, less than or equal to, and equal to 10 and 15 are considered disclosed as well as between 10 and 15, it is also understood that each unit between two particular units are also disclosed. For example, if 10 and 15 are disclosed, then 11, 12, 13, and 14 are also disclosed.

Figure 1:
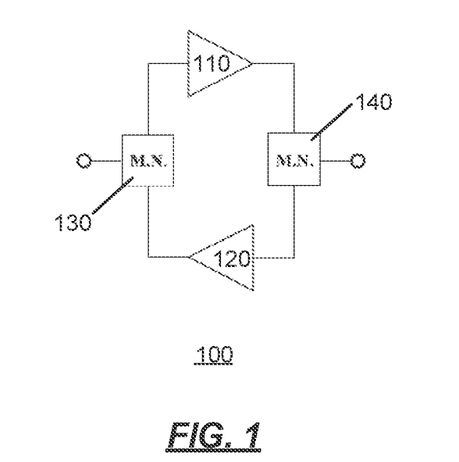
FIG. 1 is a diagram of a switchless bi-directional amplifier (BDA).

A switchless bi-directional amplifier (BDA) 100, as shown in the diagram of FIG. 1, comprises two amplifiers 110, 120 with shared input/output matching networks (M.N.) 130, 140. Only one amplifier is biased ON at one time and the parasitics of the OFF amplifier are absorbed into the shared matching network.

Figure 2:
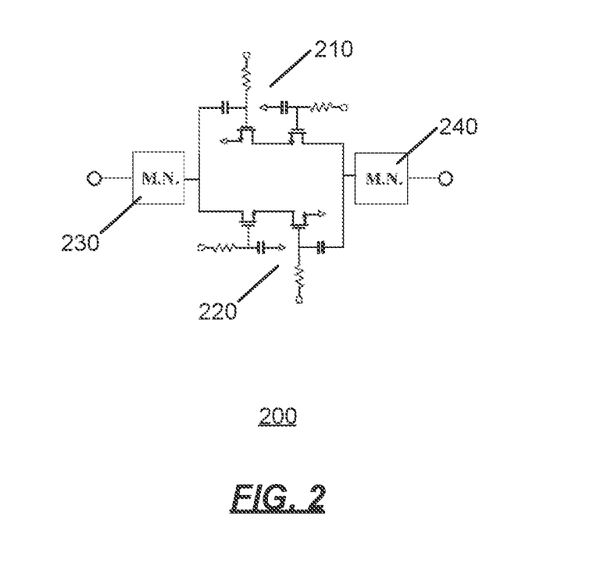
FIG. 2 is a diagram of another BDA.

FIG. 2 is a diagram of a BDA 200 implemented with two closely placed single stage cascode amplifiers 210, 220 and shared matching input-output matching networks 230, 240. Multistage distributed BDAs with single-ended cascode stages have also been demonstrated. In these implementations, the cascode topology has been favored not only for its high gain but also because of its high reverse isolation, which leads to simpler input-output matching network design and better stability.

Most of the BDAs presented in the literature adopt a single-ended core for simplicity in matching network design and layout. For loss compensation in passive T/R modules, switchless BDAs need high P1dB (i.e., the output power at 1 dB compression) to ensure overall high linearity of the module. From this perspective, differential BDAs have more potential compared to single-ended structures. As described further herein, a single-stage switchless neutralized common-emitter (CE) differential BDA is provided for loss compensation in passive T/R modules. On-chip baluns are incorporated in the design for single-ended measurement. In an implementation, the BDA is fabricated in SiGe.

Figure 3:
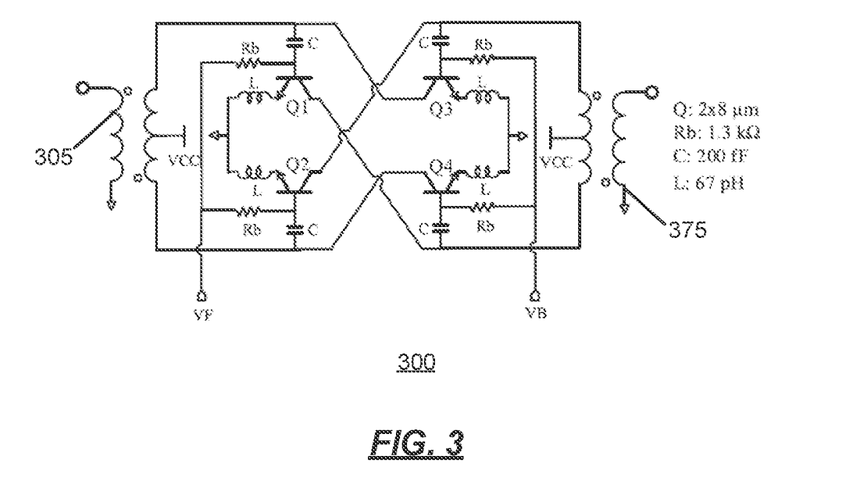
FIG. 3 is a diagram of an embodiment of a device in accordance with an embodiment.

FIG. 3 is a diagram of an embodiment of a device in accordance with an embodiment. The device is referred to as a switchless differential BDA 300. It is noted that because the switchless differential BDA 300 is shown as including input/output baluns 305, 375, the design is single-ended or unbalanced, though the core is differential. As shown in FIG. 3, the switchless differential BDA 300 comprises two cross-coupled differential CE pairs ($Q_{1,2}$ and $Q_{3,4}$) with equal transistor size, for forward and backward amplifications, respectively. The two differential pairs are cross-coupled, that is, the collectors of transistors $Q_1$ and $Q_2$ are AC coupled to the bases of transistors $Q_3$ and $Q_4$, and the collectors of transistors $Q_3$ and $Q_4$ are AC coupled to bases of transistors $Q_2$ and $Q_1$. Although the embodiments described herein may be directed to bipolar technology implementations, it is contemplated that other technology implementations may be used, such as using a neutralized differential common-source (CS) amplifier core for field-effect transistor (FET) technology implementations.

In some implementations, the transistors may be different sizes. In some implementations, the transistors can be intentionally sized differently to optimize performance under different applications. For example, in an implementation used for front-end power amplifier and low-noise amplifier (PA-LNA) for the Tx (transmission) and Rx (receiving) paths, the differential pair for the TX path will be sized larger.

A common $V_{CC}$ bias is applied to the collectors of both differential CE pairs $Q_{1,2}$ and $Q_{3,4}$ through the center tap of the secondary coils of the two input/output transformer baluns 305, 375.

To enable single-ended measurement and characterization, two transformer-based input/output baluns 305 and 375 are included. The inductor windings of the baluns that carry un-balanced signal(s) are referred to as the primary windings, and the windings that carry balanced signal(s) are referred to as the secondary windings. The secondary winding of balun 305 is AC coupled to the bases of the differential pair of transistors $Q_1$ and $Q_2$ and is both AC and DC coupled to the collectors of differential pair of transistors $Q_3$ and $Q_4$. The secondary winding of balun 375 is AC coupled to the bases of the differential pair of transistors $Q_3$ and $Q_4$ and is both AC and DC coupled to the collectors of differential pair of transistors $Q_1$ and $Q_2$. The center taps of the secondary winding of the two baluns are AC virtual grounds. The collectors of differential pair of transistors $Q_3$ and $Q_4$ are biased through the center tap of the secondary winding of balun 305. The collectors of differential pair of transistors $Q_1$ and $Q_2$ are biased through the center tap of the secondary winding of balun 375.

The input/output baluns serve various purposes. One purpose is to provide input and output matching. Matching could be achieved via various means, using baluns is just one of the options, Another purpose is to convert the balanced signal to an un-balanced signal, which makes characterization easier, since most of the mm-wave characterization equipment are designed for un-balanced signal measurement. In system designs, however, balanced signal is sometimes preferred. Many types of baluns may be used. In an implementation, a transformer balun used because it makes the most sense: compact size at the design frequency and conveniently provides a virtual ground at the center tap for DC biasing. This does not preclude the use of other types of baluns or matching networks.

DC blocking capacitors C are used to decouple the collector and base biases. Thus, the decoupling capacitors C are used to allow RF (radio frequency) signal cross coupling between the differential pairs while blocking the DC couple between the bases and collectors of the transistors. The sizing of the transistor and the choice of emitter degeneration inductance follow standard LNA (low-noise amplifier) design procedures for simultaneous gain and noise matching to ensure modest noise figure (NF). However, the transistors are biased close to peak $f_T/f_{MAX}$ current density for high linearity ($f_T$ and $F_{MAX}$ are figures of merit used to benchmark the high frequency performance of RF transistors). A resistive bias scheme is chosen for the present embodiment, although this is not intended to be limiting. Alternatively, other biasing schemes such as current mirror bias could be employed. The bias resistors Rb are used block RF signal leakage from the bases of the transistors to the bias network. Thus, the value of bias resistors Rb is chosen large enough to prevent RF signal leakage to the base bias network.

Emitter degeneration inductors L are included in the switchless differential BDA 300, The inductive degeneration inductance value is tuned to make trade-offs among amplifier gain, noise performance, and input and output matching. The use of degeneration inductors is optional.

The direction of operation is determined by selectively turning on one differential CE pair and turning off the other differential CE pair. To select forward operation, differential CE pair $Q_{1,2}$ are biased in forward-active mode, while differential CE pair $Q_{3,4}$ are turned off by pulling down the base bias of $Q_{3,4}$. The bias resistors, base-emitter junction capacitance, and degeneration inductance of differential CE pair $Q_{3,4}$ are absorbed into the output matching network.

The bases and collectors of differential CE pair $Q_{1,2}$ are cross-coupled with the collector-base (CB) junctions of differential CE pair $Q_{3,4}$ for capacitive neutralization. Capacitive neutralization is a technique commonly used in differential amplifier design to mitigate the feedback from output to input through $C_{CB}$ ($C_{GD}$ in CMOS (complementary metal-oxide-semiconductor) implementations, where GD refers to gate-drain) to enhance forward gain, increase reverse isolation, and improve stability. Because all transistors are equally sized, the capacitances of reverse biased differential CE pair $Q_{3,4}$ CB junctions are comparable to $C_{CB}$ of differential CE pair $Q_{1,2}$, and therefore the CB junctions of differential CE pair $Q_{3,4}$ are suitable for providing capacitive neutralization for differential CE pair $Q_{1,2}$. Should the differential pairs be sized differently (e.g., implement different sized transistors), additional capacitors may be included in the device to compensate for the $C_{CB}$ difference of the differently sized differential pairs.

The switchless differential BDA 300 cross-couples the two differential CE pairs of amplifier transistor and takes advantage of the OFF amplifier to enhance the performance of the ON amplifier, whereas the OFF amplifier in the conventional single-ended topology contributes only parasitics to input and output matching. Moreover, because the switchless differential BDA 300 uses common-emitter topology, the required supply level is lower than conventional BDA devices that employ a cascade amplifier core.

Figure 4:
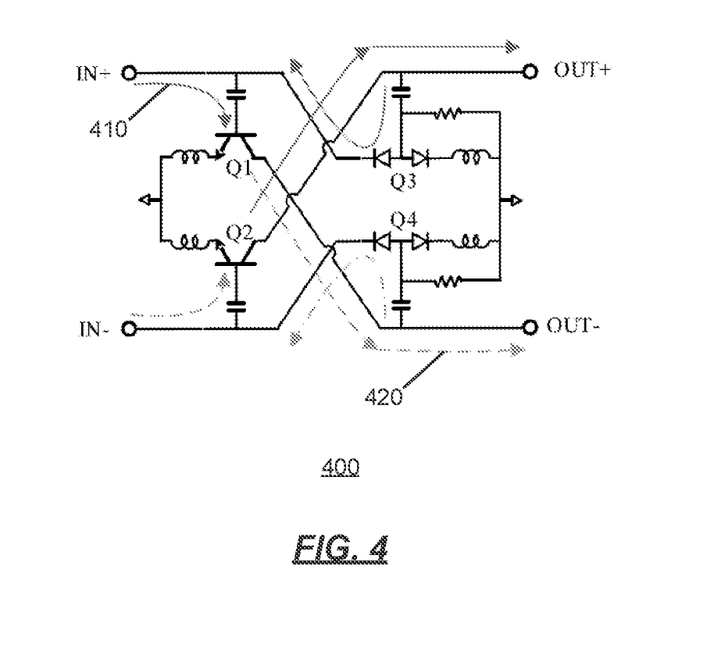
FIG. 4 is a diagram showing forward operation of an example device.

FIG. 4 is a diagram showing forward operation of an example device 400, such as a device similar to that described in FIG. 3. In the diagram of FIG. 4, solid arrows 410 represent positive signal flow and dashed arrows 420 represent inverted signal flow. For simplicity of the diagram, the input base bias resistors and the two transformer baluns from FIG. 3 are omitted in FIG. 4. Unlike the single-ended topology shown in FIG. 2, where the OFF amplifier only contributes parasitics in the matching networks, the differential topology of FIG. 3 and FIG. 4 takes advantage of the OFF amplifier to enhance the performance of the ON amplifier through capacitive neutralization.

The amplifier 400 is biased in forward operation mode. $V_{CC}$ supply is applied to the two differential pairs of transistors through the center taps of the secondary windings of the two input/output transformer baluns (not shown in FIG. 4). The differential pair of transistors $Q_1$ and $Q_2$ are turned on by applying a base bias voltage through the bias resistors. The transistors $Q_3$ and are turned off by pulling down their base bias. The OFF transistor pair $Q_3$ and $Q_4$ are represented using effective CB and EB junction diodes.

For readability, the two baluns and the bias resistors on $Q_1$ and $Q_2$ are omitted in FIG. 4. The input terminals are labeled as IN+ and IN−, and the output terminals are denoted as OUT+ and OUT−. The flow of positive signal is labelled with e solid arrows 410 and the dashed arrows 420 mark the flow of negative signal. It is noted that the positive signals and the negative signals are relative concepts and may be defined arbitrarily but are to remain consistent once defined.

An incident RF signal is applied to the input terminals IN+ and IN−. Most of the positive RF signal power (represented by the arrows 410) flows in to the base through the decoupling capacitor. An inverted and amplified signal (represented by the arrows 420) exits the collector of the transistor $Q_1$ and reaches negative output terminal OUT−. A small part of the signal represented by the arrows 420 will flow back to the base of transistor $Q_2$ through the CCB (collector-base capacitance) of transistor $Q_4$. This signal has the same polarity as the incident input signal at the base of transistor $Q_2$. Similarly, a small part of the positive output signal is feedback to the base of transistor $Q_1$ through the CCB of transistor $Q_3$. This positive feedback mechanism helps to mitigate the Miller capacitance of the active differential pair of transistors $Q_1$ and $Q_2$, and is commonly known as capacitive neutralization.

The $C_{EB}$, bias resistors, and emitter degeneration inductors of transistors $Q_3$ and $Q_4$ load the output and are absorbed into the output matching network.

The degeneration inductors of transistors $Q_1$ and $Q_2$ provide local negative feedback to transistors $Q_1$ and $Q_2$. The degeneration inductors provide an additional degree freedom for trade-off among amplifier gain, noise performance, and matching.

In an implementation, the differential BDA, such as the BDA 300, is a 28 GHz differential BDA that is designed and fabricated in the GlobalFoundries (GE) 8 HP 0.13-μm SiGe BiCMOS platform. The dimensions of an embodiment of the BDA are 0.71×0.90 mm² including bondpads. The circuit can be fully biased through either set of DC pads on the north and south sides. A 1.6 V $V_{CC}$ is applied to the collectors of the transistors with a 0.91 V base bias for the active differential pair (the actual $V_{BE}$ is 0.86 V from an inventor's simulation). The embodiment of the circuit draws 16.8 mA of DC current. Although an implementation is described with respect to GF's 8 HP SiGe BiCMOS platform, the concepts and techniques described and contemplated herein are not limited thereto and can be implemented on other technology platforms.

Figure 5:
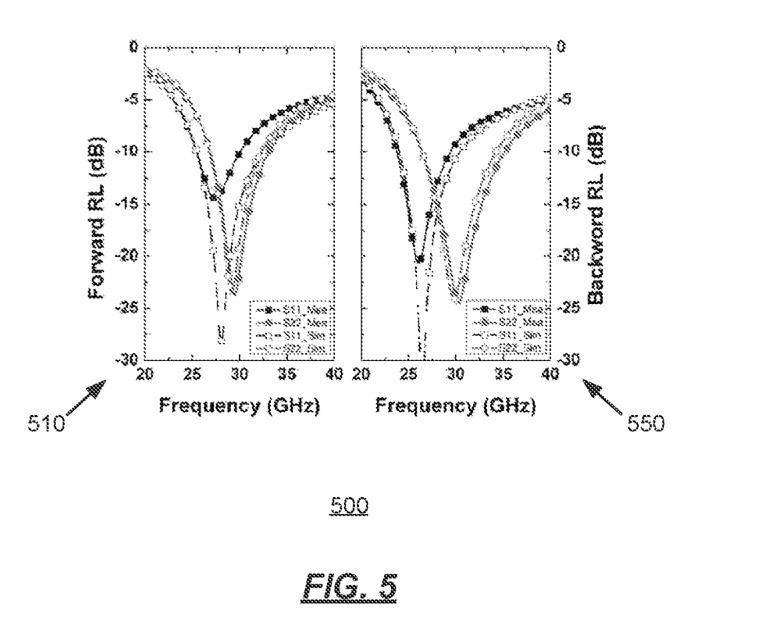
FIG. 5 is a diagram showing the simulated and measured return loss under forward operation bias, and the simulated and measured return loss under backward operation bias.

Both the forward and backward operation are characterized and compared. FIG. 5 is a diagram 500 showing the simulated and measured return loss under forward operation bias 510, and the simulated and measured return loss under backward operation bias 550. Scattering parameters (also known as S parameters) $S_{11}$ and $S_{22}$ of both operational modes are under −10 dB between 26.5 GHz and 29.5 GHz.

Figure 6:
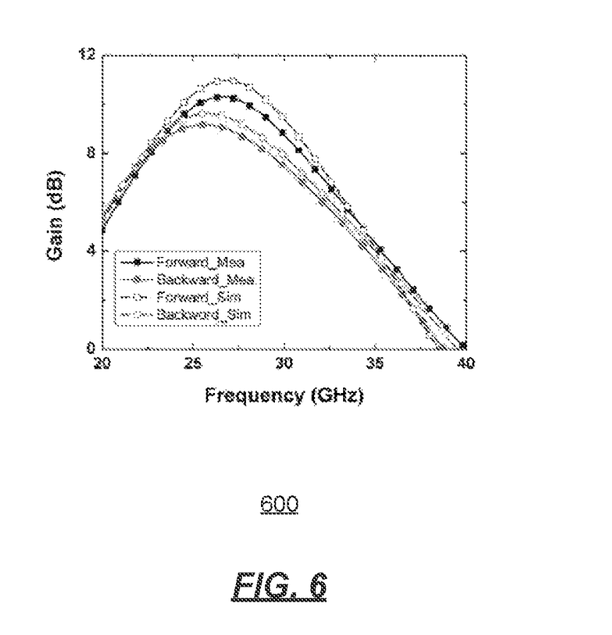
FIG. 6 is a diagram showing the simulated and measured a of forward and backward operations.

FIG. 6 is a diagram 600 showing the simulated and measured gain of forward and backward operations. The measured forward operational gain is 10 dB, and the gain for backward operation is 8.6 dB, at 28 GHz. The measured gain characteristics show a close match with simulation results, with maximum of 0.6 dB difference. The 1.4 dB gain difference between the forward and backward operations is a result of the asymmetric cross-coupling routing (three cross-overs as shown in FIG. 4) between the two differential pairs. The measured results show 10 GHz 3 dB bandwidth from 22 GHz to 32 GHz for the two operational modes.

Figure 7:
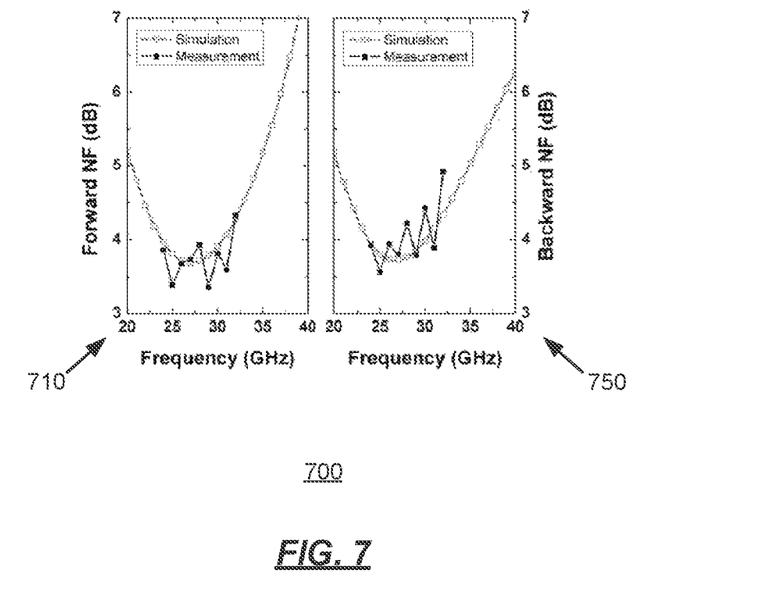
FIG. 7 is a diagram showing the measured and simulated noise figures (NF) of forward operation and backward operation.

FIG. 7 is a diagram 700 showing the measured and simulated noise figures (NF) of forward operation 710 and backward operation 750. Forward operation shows 3.9 dB NF at 28 GHz, and the NF of backward operation at 28 GHz is 4.2 dB.

Figure 8:
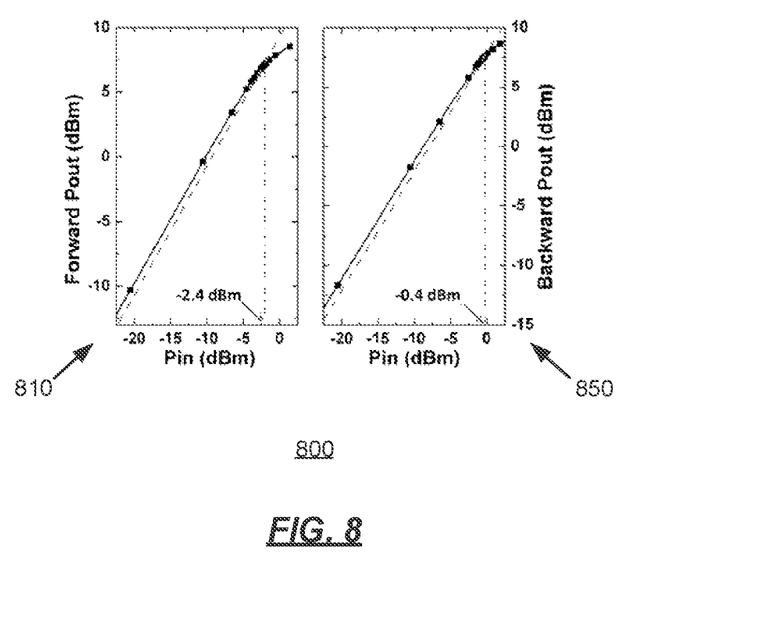
FIG. 8 is a diagram showing the P1dB measurement of forward operation and backward operation.

FIG. 8 is a diagram 800 showing the P1db measurement of forward operation 810 and backward operation 850. The measured input-referred P1dB of forward operation is −2.4 dBm, and that of backward operation is −0.4 dBm.

Thus, a differential BDA device is disclosed that takes advantage of the parasitics of the OFF amplifier to achieve performance enhancement. With respect to conventional circuit designs and topologies, the differential BDA device shows competitive performance in gain, NF and P1dB, and has the low power consumption.

In an implementation, the design and implementation of a 28-GHz switchless CE differential SiGe BDA is attained. The circuit occupies a modest chip area of 0.71×0.90 mm² and consumes 26.9 mW of dc power under a 1.6 V $V_{CC}$ and 0.91 V base bias. At 28 GHz, the forward operational mode provides 10 dB gain and an input-referred P1dB of −2.4 dBm, while the gain of the backward operational mode is 1.6 dB lower than that of the forward operation, and it has a higher input-referred P1dB. This asymmetric performance between the two modes of operation is the result of signal line crossovers between the two CE differential pairs. Although this performance difference can potentially be compensated for by optimizing biasing and matching networks, this asymmetry is not necessarily a disadvantage for loss compensation application in T/R modules, because the gain and P1dB requirements for the BDA in transmitting and receiving paths can be different.

In an implementation, a bi-directional amplifier (BDA) comprises a first pair of amplifier transistors and a second pair of amplifier transistors. The first pair of amplifier transistors are cross-coupled with the second pair of amplifier transistors, and wherein the first pair of amplifier transistors and the second pair of amplifier transistors each comprise a differential common-emitter (CE) pair or a differential common-source (CS) pair.

Implementations may include some or all of the following features. The BDA further comprises a plurality of blocking capacitors to decouple the collector and the base biases, or the drain and gate biases, of the first pair of amplifier transistors and the second pair of amplifier transistors. The BDA further comprises two input/output baluns, wherein a common voltage bias is applied to the collectors of each of the differential CE pairs or to the drains of the differential CS pairs, and wherein the two input/output baluns enable single-ended measurement and characterization. The first pair of amplifier transistors and the second pair of amplifier transistors are configured to provide a direction of operation when one differential CE or CS pair is turned on and the other differential CE pair or CS pair is turned off. The first pair of amplifier transistors cross-coupled with the second pair of amplifier transistors comprises the bases and collectors of the first differential CE pair or the drains and gates of the first differential CS pair cross-coupled with the collector-base (CB) junctions or the drain-gate junctions of the second pair of amplifier transistors for capacitive neutralization. The performance of the first pair of amplifier transistors when ON is enhanced by the second pair of amplifier transistors that are turned off. The BDA further comprises a neutralized differential common-emitter (CE) or common-source (CS) amplifier core. The BDA is switchless. The BDA is a switchless differential BDA. Each differential CE pair or differential CS pair comprises transistors of equal sizes. Each differential CE pair or differential CS pair comprises transistors of different sizes.

In an implementation, a method comprises supplying collector or drain voltage to two differential pairs of transistors of a bi-directional amplifier (BDA), wherein each of the two differential pairs of transistors comprises a pair of amplifier transistors; turning on a first pair of the two differential pairs of transistors by applying a base or gate bias voltage to the one differential pair of transistors; and turning off a second pair of the two differential pairs of transistors by pulling down the base or gate bias of the transistors of the second pair.

Implementations may include some or all of the following features. A first pair of amplifier transistors are cross-coupled with a second pair of amplifier transistors, and wherein the first pair of amplifier transistors and the second pair of amplifier transistors each comprise a differential common-emitter (CE) pair or a differential common-source (CS) pair. The BDA is biased in forward operation mode. Supplying the collector or drain voltage comprises supplying the voltage through center taps of secondary windings of two input/output transformer baluns in electrical connection with the BDA. The method further comprises providing an incident RF (radio frequency) signal to two input terminals of the BDA. Positive RF signal power flows in to the base of a transistor of one of the two differential pairs of transistors through a decoupling capacitor, and an inverted and amplified signal exits the collector of the transistor and reaches a negative output terminal of the BDA.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A bi-directional amplifier (BDA) comprising:
a first pair of amplifier transistors; and
a second pair of amplifier transistors,
wherein the first pair of amplifier transistors are cross-coupled with the second pair of amplifier transistors, and wherein the first pair of amplifier transistors and the second pair of amplifier transistors each comprise a differential common-emitter (CE) pair or a differential common-source (CS) pair, and wherein the first pair of amplifier transistors cross-coupled with the second pair of amplifier transistors comprises the bases and collectors of the first differential CE pair or the drains and gates of the first differential CS pair cross-coupled with the collector-base (CB) junctions or the drain-gate junctions of the second pair of amplifier transistors for capacitive neutralization.

2. The BDA of claim 1, further comprising a plurality of blocking capacitors to decouple the collector and the base biases, or the drain and gate biases, of the first pair of amplifier transistors and the second pair of amplifier transistors.

3. The BDA of claim 1, further comprising two input/output baluns, wherein a common voltage bias is applied to the collectors of each of the differential CE pairs or to the drains of the differential CS pairs, and wherein the two input/output baluns enable single-ended measurement and characterization.

4. The BDA of claim 1, wherein the first pair of amplifier transistors and the second pair of amplifier transistors are configured to provide a direction of operation when one differential CE or CS pair is turned on and the other differential CE pair or CS pair is turned off.

5. The BDA of claim 1, wherein the performance of the first pair of amplifier transistors when ON is enhanced by the second pair of amplifier transistors that are turned off.

6. The BDA of claim 1, wherein the BDA is switchless.

7. The BDA of claim 1, wherein the BDA is a switchless differential BDA.

8. The BDA of claim 1, wherein each differential CE pair or differential CS pair comprises transistors of equal sizes.

9. The BDA of claim 1, wherein each differential CE pair or differential CS pair comprises transistors of different sizes.

10. A bi-directional amplifier (BDA) comprising:
a first pair of amplifier transistors; and
a second pair of amplifier transistors, wherein the first pair of amplifier transistors are cross-coupled with the second pair of amplifier transistors, and wherein the first pair of amplifier transistors and the second pair of amplifier transistors each comprise a differential common-emitter (CE) pair or a differential common-source (CS) pair; and
a neutralized differential common-emitter (CE) or common-source (CS) amplifier core.

11. The BDA of claim 10, wherein the BDA is switchless.

12. The BDA of claim 10, wherein the BDA is a switchless differential BDA.

13. The BDA of claim 10, wherein each differential CE pair or differential CS pair comprises transistors of equal sizes.

14. The BDA of claim 10, wherein each differential CE pair or differential CS pair comprises transistors of different sizes.

15. The BDA of claim 10, wherein the performance of the first pair of amplifier transistors when ON is enhanced by the second pair of amplifier transistors that are turned off.

16. A method comprising:
supplying collector or drain voltage to two differential pairs of transistors of a bi-directional amplifier (BDA), wherein each of the two differential pairs of transistors comprises a pair of amplifier transistors, wherein supplying the collector or drain voltage comprises supplying the voltage through center taps of secondary windings of two input/output transformer baluns in electrical connection with the BDA;
turning on a first pair of the two differential pairs of transistors by applying a base or gate bias voltage to the one differential pair of transistors; and
turning off a second pair of the two differential pairs of transistors by pulling down the base or gate bias of the transistors of the second pair.

17. The method of claim 16, wherein a first pair of amplifier transistors are cross-coupled with a second pair of amplifier transistors, and wherein the first pair of amplifier transistors and the second pair of amplifier transistors each comprise a differential common-emitter (CE) pair or a differential common-source (CS) pair.

18. The method of claim 16, wherein the BDA is biased in forward operation mode.

19. The method of claim 16, further comprising providing an incident RF (radio frequency) signal to two input terminals of the BDA.

20. The method of claim 19, wherein positive RF signal power flows in to the base of a transistor of one of the two differential pairs of transistors through a decoupling capacitor, and an inverted and amplified signal exits the collector of the transistor and reaches a negative output terminal of the BDA.

* * * * *